United States Patent
Nakayama et al.

(10) Patent No.: US 11,301,195 B2
(45) Date of Patent: Apr. 12, 2022

(54) DISPLAY DEVICE AND VEHICLE COMPRISING THE SAME

(71) Applicant: TOYOTA JIDOSHA KABUSHIKI KAISHA, Toyota (JP)

(72) Inventors: Kimihiro Nakayama, Nagoya (JP); Kosuke Yoshida, Nagakute (JP); Kohki Nakamura, Okazaki (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/161,141

(22) Filed: Jan. 28, 2021

(65) Prior Publication Data
US 2021/0149617 A1 May 20, 2021

Related U.S. Application Data

(63) Continuation of application No. 16/541,677, filed on Aug. 15, 2019.

(30) Foreign Application Priority Data

Oct. 19, 2018 (JP) .............................. JP2018-197631

(51) Int. Cl.
| | |
|---|---|
| G06F 3/14 | (2006.01) |
| B60K 35/00 | (2006.01) |
| G07C 5/08 | (2006.01) |
| B60L 58/16 | (2019.01) |
| B60K 6/22 | (2007.10) |

(52) U.S. Cl.
CPC ............... *G06F 3/14* (2013.01); *B60K 35/00* (2013.01); *G07C 5/0825* (2013.01); *B60K 6/22* (2013.01); *B60L 58/16* (2019.02); *B60Y 2200/92* (2013.01)

(58) Field of Classification Search
None
See application file for complete search history.

(56) References Cited

U.S. PATENT DOCUMENTS

| | | |
|---|---|---|
| 6,437,699 B1 | 8/2002 | Hayakawa |
| 2003/0054229 A1 | 3/2003 | Odaohhara et al. |
| 2007/0029974 A1 | 2/2007 | Uchida |
| 2015/0162768 A1 | 6/2015 | Okuda et al. |

FOREIGN PATENT DOCUMENTS

| | | |
|---|---|---|
| EP | 2857855 A1 | 4/2015 |
| JP | 2003-92838 A | 3/2003 |
| JP | 2007-74891 A | 3/2007 |

(Continued)

OTHER PUBLICATIONS

Final Office Action dated May 12, 2021 in U.S. Appl. No. 16/541,677.

(Continued)

*Primary Examiner* — Jwalant Amin
(74) *Attorney, Agent, or Firm* — Sughrue Mion, PLLC

(57) ABSTRACT

A display device includes a display configured to display a deterioration degree of a secondary battery and a controller. The controller is configured to control the display such that the display does not display the deterioration degree when the deterioration degree is lower than a first level, or configured to control the display such that the display does not display the deterioration degree when the deterioration degree is higher than a second level that is higher than the first level.

5 Claims, 16 Drawing Sheets

(56) References Cited

FOREIGN PATENT DOCUMENTS

| | | |
|---|---|---|
| JP | 2011-257213 A | 12/2011 |
| JP | 5672778 B2 | 2/2015 |
| JP | 2015-109237 A | 6/2015 |
| JP | 2016-63692 A | 4/2016 |
| WO | 2011/155128 A1 | 12/2011 |
| WO | 2013/179350 A1 | 12/2013 |

OTHER PUBLICATIONS

Communication dated Feb. 19, 2021, issued by the United States Patent and Trademark Office in U.S. Appl. No. 16/541,677.
Notice of Allowance issued to U.S. Appl. No. 16/541,677 dated Nov. 16, 2021.
Notice of Allowance dated Sep. 7, 2021 from the United States Patent and Trademark Office in U.S. Appl. No. 16/541,677.

|  | | SOC (%) | | | | |
|---|---|---|---|---|---|---|
|  | | 0 TO 5 | 5 TO 10 | ... | 90 TO 95 | 95 TO 100 |
| BATTERY TEMPERATURE Tb (°C) | -40 TO | R11 | | ... | | Rm1 |
| | -35 TO | R12 | | ... | | Rm2 |
| | ⋮ | ⋮ | ⋮ | ... | | ⋮ |
| | 60 TO | Rn1 | | ... | | Rnm | ively, it is supposed that the user cannot deter-
DISPLAY DEVICE AND VEHICLE COMPRISING THE SAME

INCORPORATION BY REFERENCE

This application is a continuation of U.S. application Ser. No. 16/541,677 filed Aug. 15, 2019, which claims priority to Japanese Patent Application No. 2018-197631 filed on Oct. 19, 2018, each of which is incorporated herein by reference in its entirety.

BACKGROUND

1. Technical Field

The present disclosure relates to a display device and a vehicle including the same, and particularly, to a display device that displays a deterioration degree of a secondary battery, and a vehicle including the same.

2. Description of Related Art

Japanese Patent No. 5672778 (JP 5672778 B) discloses a display device that displays a value of full charge capacity with a power capacity in a full charge state of a battery (secondary battery) (see JP 5672778 B).

SUMMARY

In the secondary battery, it is known that a reduction in full charge capacity, an increase in internal resistance, or the like occur over time, which leads to deterioration of the secondary battery over time. When a deterioration degree of the secondary battery is displayed to a user, some display methods may cause the user to feel anxious about the deterioration of the secondary battery.

The present disclosure provides a display device that displays a deterioration degree of a secondary battery without causing a user to feel anxious as much as possible, and a vehicle including the same.

A first aspect of the present disclosure relates to a display device including a display configured to display a deterioration degree of a secondary battery and a controller. The controller is configured to control the display such that the display does not display the deterioration degree when the deterioration degree is lower than a first level, or configured to control the display such that the display does not display the deterioration degree when the deterioration degree is higher than a second level that is higher than the first level.

In general, deterioration characteristics of the secondary battery have a tendency that deterioration progresses rapidly at the initial stage immediately after manufacture, and then is rendered stable. For example, when the secondary battery is used for a power source (power supply for driving) of a vehicle, there is generally a time lag (for example, several weeks or several months) from when the secondary battery is manufactured to when the manufactured secondary battery is mounted on the vehicle and a user starts using the vehicle (secondary battery). Since the above-mentioned deterioration of the secondary battery progresses rapidly during the period of time, when a deterioration degree of the secondary battery is displayed to the user at the time when the user starts using the vehicle (when the vehicle is delivered), it may make the user feel anxious about the fact that the deterioration of the secondary battery is already in progress even at the time. With the display device according to the first aspect, since the deterioration degree is not displayed when the deterioration degree is lower than the first level, it is possible to avoid giving the user the anxiety about the fact that the deterioration of the secondary battery is already in progress at the time when the user starts using the vehicle (when the vehicle is delivered).

Alternatively, it is supposed that the user cannot determine the replacement timing of the secondary battery which is deteriorating only based on the displaying of the deterioration degree. With the display device according to the first aspect, since the deterioration degree is not displayed when the deterioration degree is higher than the second level, it is possible to make the user recognize that the replacement timing of the secondary battery is approaching by not displaying the deterioration degree.

In the display device according to the first aspect, the controller may be configured to control the display such that the display does not display the deterioration degree when the deterioration degree is lower than the first level. The controller may be configured to control the display such that the display does not display the deterioration degree when the deterioration degree is higher than the second level.

With the display device according to the first aspect of the present disclosure, for example, when the secondary battery is used for the power source (power supply for driving) of the vehicle, it is possible to suppress the uncomfortable feeling of the user due to the fact that the deterioration of the secondary battery is already in progress at the time when the user starts using the vehicle (when the vehicle is delivered), and when the deterioration is in progress, it is possible to make the user recognize that the replacement timing of the secondary battery is approaching.

In the display device according to the first aspect, the controller may be configured to control the display such that the display displays a notification indicating that the secondary battery is not deteriorated when the deterioration degree is lower than the first level.

It is also supposed that some users may feel anxious about the fact that the deterioration is not displayed. With the display device according to the first aspect, since it is specified that the secondary battery is not deteriorated, it is possible to suppress the anxiety which the user feels.

In the display device according to the first aspect, the controller may be configured to control the display such that the display displays a notification prompting replacement of the secondary battery when the deterioration degree is higher than the second level.

With the display device according to the first aspect, it is possible to explicitly prompt the user to replace the secondary battery.

In the display device according to the first aspect, the controller may be configured to control the display such that the display changes display of the deterioration degree stepwise when the display displays the deterioration degree.

It is also supposed that some users may feel anxious about the fact that the deterioration degree increases sequentially when the deterioration degree calculated by a calculating unit is sequentially displayed. With the display device according to the first aspect, since the display of the deterioration degree is changed stepwise, it is possible to suppress the anxiety that the user can feel as compared with the case where the display of the deterioration degree is sequentially changed.

A second aspect of the present disclosure relates to a display device including a display configured to display a deterioration degree of a secondary battery and a controller. The controller is configured to control the display such that the display changes a display mode of the deterioration degree when the deterioration degree is lower than a first level from that when the deterioration degree is equal to or higher than a first level, or configured to control the display such that the display changes the display mode of the deterioration degree when the deterioration degree is higher than a second level that is higher than the first level from that when the deterioration degree is equal to or lower than the second level.

With the display device according to the second aspect of the present disclosure, since the display mode of the deterioration degree is changed when the deterioration degree is lower than the first level, it is possible to avoid giving the user the anxiety about the fact that the deterioration degree of the secondary battery is already in progress at the time when the user starts using the vehicle (when the vehicle is delivered). Alternatively, with the display device according to the second aspect of the present disclosure, since the display mode of the deterioration mode is changed when the deterioration degree is higher than the second level, it is possible to make the user recognize that the replacement timing of the secondary battery is approaching by changing the display mode of the deterioration degree.

A third aspect of the present disclosure relates to a display device including a display configured to display a deterioration degree of a secondary battery and a controller. The controller is configured to control the display such that the display displays, in addition to the display of the deterioration degree, a notification indicating that the secondary battery is not deteriorated, when the deterioration degree is lower than a first level, or configured to control the display such that the display displays, in addition to the display of the deterioration degree, a notification prompting replacement of the secondary battery, when the deterioration degree is higher than a second level that is higher than the first level.

With the display device according to the third aspect of the present disclosure, since the notification indicating that the secondary battery is not deteriorated is further displayed when the deterioration degree is lower than the first level, it is possible to avoid giving the user the anxiety about the fact that the deterioration degree of the secondary battery is already in progress at the time when the user starts using the vehicle (when the vehicle is delivered). Alternatively, with the display device according to the third aspect of the present disclosure, since the notification prompting replacement of the secondary battery is further displayed when the deterioration degree is higher than the second level, it is possible to make the user recognize that the replacement timing of the secondary battery is approaching by changing the display mode of the deterioration degree.

A fourth aspect of the present disclosure relates to a vehicle a secondary battery and a display device configured to include a display and a controller. The display is configured to display a deterioration degree of the secondary battery. The controller is configured to control the display such that the display does not display the deterioration degree when the deterioration degree is lower than a first level, or configured to control the display such that the display does not display the deterioration degree when the deterioration degree is higher than a second level that is higher than the first level.

With the vehicle according to the fourth aspect of the present disclosure, it is possible to avoid giving the user the anxiety about the fact that the deterioration degree of the secondary battery is already in progress at the time when the user starts using the vehicle (when the vehicle is delivered). Furthermore, when the deterioration degree is higher than the second level, it is possible to make the user recognize that the replacement timing of the secondary battery is approaching.

According to the aspects of the present disclosure, the deterioration degree of the secondary battery can be displayed without giving the user anxiety as much as possible.

BRIEF DESCRIPTION OF THE DRAWINGS

Features, advantages, and technical and industrial significance of exemplary embodiments of the present disclosure will be described below with reference to the accompanying drawings, in which like numerals denote like elements, and wherein.

DETAILED DESCRIPTION OF EMBODIMENTS

Figure 1:
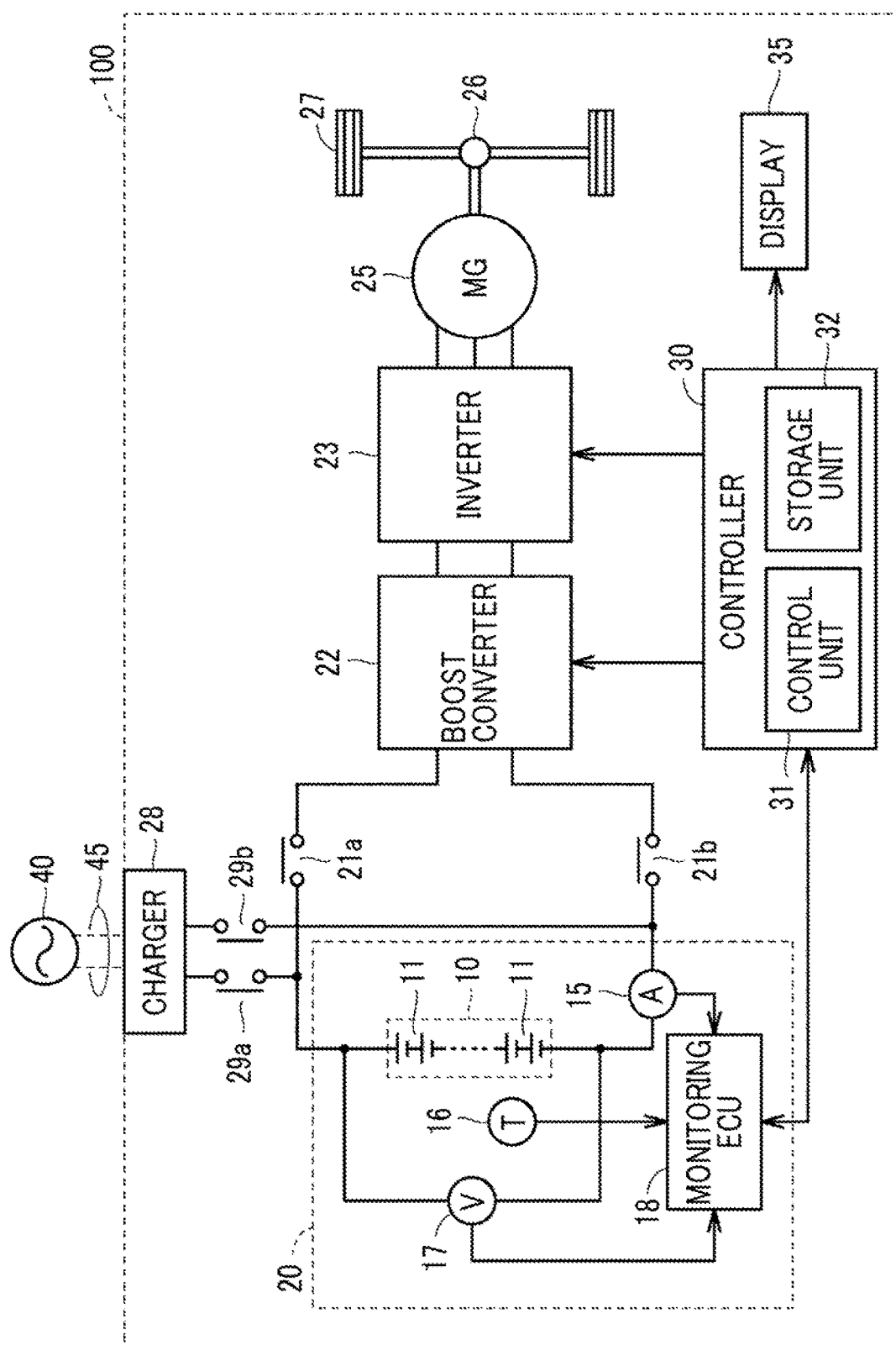
FIG. 1 is a block diagram of a configuration example of a vehicle to which a display device is applied according to a first embodiment of the present disclosure.

Hereinafter, embodiments of the present disclosure will be described in detail with reference to the drawings. In the drawings, the same or like reference signs will be used to designate the same or like components, and therefore description thereof will not be repeated.

First Embodiment

FIG. 1 is a block diagram of a configuration example of a vehicle to which a display device is applied according to a first embodiment of the present disclosure. With reference to FIG. 1, a vehicle 100 includes a main battery 10, a boost converter 22, an inverter 23, a motor generator 25, a transmission gear 26, driving wheels 27, and a controller 30.

The main battery 10 is mounted to the vehicle 100 as the drive power supply of the vehicle 100 (that is, power source). That is, the vehicle 100 is an electric vehicle or a hybrid vehicle that employs the main battery 10 as the vehicle drive power supply. The hybrid vehicle is a vehicle provided with an engine, a fuel cell, or the like (not shown) as the power source of the vehicle 100 in addition to the main battery 10. The electric vehicle is a vehicle provided with only the main battery 10 as the power source of the vehicle 100.

The main battery 10 is formed of a battery set (battery pack) 20 including a plurality of battery modules 11. Each battery module 11 is formed to include a secondary rechargeable battery cell, of which a typical example is a lithium ion secondary battery. The lithium ion battery is a secondary battery in which lithium ions as charge carriers are transported, and may include what is called an all-solid battery using a solid electrolyte as well as a general lithium ion secondary battery using a liquid electrolyte.

The battery pack 20 is provided with a current sensor 15, a temperature sensor 16, a voltage sensor 17, and a battery monitoring unit 18. The battery monitoring unit 18 is formed of an electronic control unit (ECU), for example. Hereinafter, the battery monitoring unit 18 is also referred to as a monitoring ECU 18.

The current sensor 15 detects an input/output current of the main battery 10 (hereinafter, also referred to as a battery current Ib). The temperature sensor 16 detects temperature of the main battery 10 (hereinafter, also referred to as a battery temperature Tb). A plurality of temperature sensors 16 may be disposed. In this case, the weighted average value, the maximum value or the minimum value of the temperatures detected by the temperature sensors 16 can be used as the battery temperature Tb, or the temperature detected by a specific temperature sensor 16 can be used as the battery temperature Tb. The voltage sensor 17 detects an output voltage of the main battery 10 (hereinafter, also referred to as a battery voltage Vb).

The monitoring ECU 18 receives detection values from the current sensor 15, the temperature sensor 16, and the voltage sensor 17, and outputs the battery voltage Vb, the battery current Ib, and the battery temperature Tb to the controller 30. Alternatively, the monitoring ECU 18 can also store data of the battery voltage Vb, the battery current Ib, and the battery temperature Tb in a built-in memory (not shown).

Further, the monitoring ECU 18 has a function of calculating a state of charge (SOC) of the main battery 10 using at least a part of the battery voltage Vb, the battery current Ib, and the battery temperature Tb. The SOC represents the current storage amount to the full charge capacity of the main battery 10 as a percentage. It is also possible that the calculating function of the SOC is provided to the controller 30 (which will be described later).

The main battery 10 is connected to the boost converter 22 through system main relays 21a, 21b. The boost convener 22 boosts the output voltage of the main battery 10. The boost converter 22 is connected to the inverter 23, and the inverter 23 converts DC power from the boost converter 22 into AC power.

The motor generator (three-phase motor) 25 receives the AC power from the inverter 23 to generate kinetic energy for causing the vehicle to travel. The kinetic energy generated by the motor generator 25 is transmitted to the driving wheels 27. On the other hand, while the vehicle 10 is being decelerated or is being brought to a stop, the motor generator 25 converts the kinetic energy of the vehicle 100 into electrical energy. The AC power generated by the motor generator 25 is converted into DC power by the inverter 23, and supplied to the main battery 10 through the boost converter 22. In this way, the regenerative power can be stored in the main battery 10. Accordingly, the motor generator 25 is configured to generate a driving force or a braking force of the vehicle 100 with exchange of power with the main battery 10 (that is, charging/discharging of the main battery 10).

The boost converter 22 can be omitted. In addition, when a DC motor is used as the motor generator 25, the inverter 23 can be omitted.

Furthermore, when the vehicle 100 is the hybrid vehicle in which an engine (not shown) is further mounted as a power source, in addition to the output of the motor generator 25, the engine output can be used as the driving force for causing the vehicle to travel. Alternatively, the motor generator 25 (not shown) that generates electrical power by the engine output can be further mounted, and accordingly it is also possible to generate charging power of main battery 10 by the engine output.

The controller 30 is formed of an electronic control unit (ECU), and is configured to include a control unit 31 and a storage unit 32. In the storage unit 32, various data or programs for operating the control unit 31 is stored. The storage unit 32 allows the control unit 31 to read and write data and can be provided outside the controller 30.

The controller 30 controls operations of the system main relays 21a, 21b, the boost converter 22 and the inverter 23. When a start switch (not shown) is switched from on to off, the controller 30 switches the system main relays 21a, 21b from off to on, or operates the boost converter 22 and the inverter 23. Furthermore, when the start switch is switched from on to off, the controller 30 switches the system main relays 21a, 21b from off to on, or stops operations of the boost converter 22 and the inverter 23.

The vehicle 100 further includes a display 35. The display 35 is configured to display predetermined information regarding the user of the vehicle 100 in response to a control command from the controller 30. Specifically, the display 35 displays at least the SOC and the deterioration degree (which will be described later) of the main battery 10 to the user.

Since the SOC represents the current storage amount to the full charge capacity of the main battery 10 as a percentage, when the deterioration degree of the main battery 10 progresses and the charge capacity of the main battery 10 decreases, the actual storage amount (Wh) (it may be Ah, and the same applies below) is reduced even with the same SOC value (for example, SOC=100%). Therefore, in the first embodiment, as the data indicating the state of the main battery 10, the deterioration degree of the main battery 10 is presented to the user by the display 35 together with the SOC of the main battery 10. The display 35 can be formed of, for example, a touch panel display using a liquid crystal panel.

The vehicle 100 may be configured to have an external charging function for charging the main battery 10 by an external power supply 40. In this case, the vehicle 100 further includes a charger 28 and charge relays 29a, 29b.

The external power supply 40 is a power supply provided outside the vehicle, and as the external power supply 40, for example, a commercial AC power supply can be applied. The charger 28 converts the power from the external power supply 40 into the charging power of the main battery 10. The charger 28 is connected to the main battery 10 through the charge relays 29a, 29b. When the charge relays 29a, 29b are on, the main battery 10 can be charged with the power from the external power supply 40.

The external power supply 40 and the charger 28 can be connected to, for example, using a charging cable 45. That is, during the mounting of the charging cable 45, the external power supply 40 and the charger 28 are electrically connected, and accordingly, the main battery 10 can be charged by the external power supply 40. Alternatively, the vehicle 100 may be configured such that power is transmitted between the external power supply 40 and the charger 28 in a contactless manner. For example, power is transmitted through a power-receiving coil (not shown) on the external power supply side and a power-receiving coil (not shown) on the vehicle side, and accordingly, the main battery 10 can be charged by the external power supply 40.

As described above, when AC power is supplied from the external power supply 40, the charger 28 is configured to have a function of converting the power supplied from the external power supply 40 into the charging power (DC power) of the main battery 10. Alternatively, when the external power supply 40 directly supplies the charging power of the main battery 10, all the charger 28 need to do is to transmit the DC power from the external power supply 40 to the main battery 10. The mode of the external charging of the vehicle 100 is not particularly limited.

The vehicle 100 travels with charging/discharging of the main battery 10. Furthermore, when the vehicle 100 has the external charging function, the main battery 10 is charged while the vehicle 100 is stopped. With such charging/discharging of the main battery 10, the main battery 10 deteriorates over time.

Figure 2:
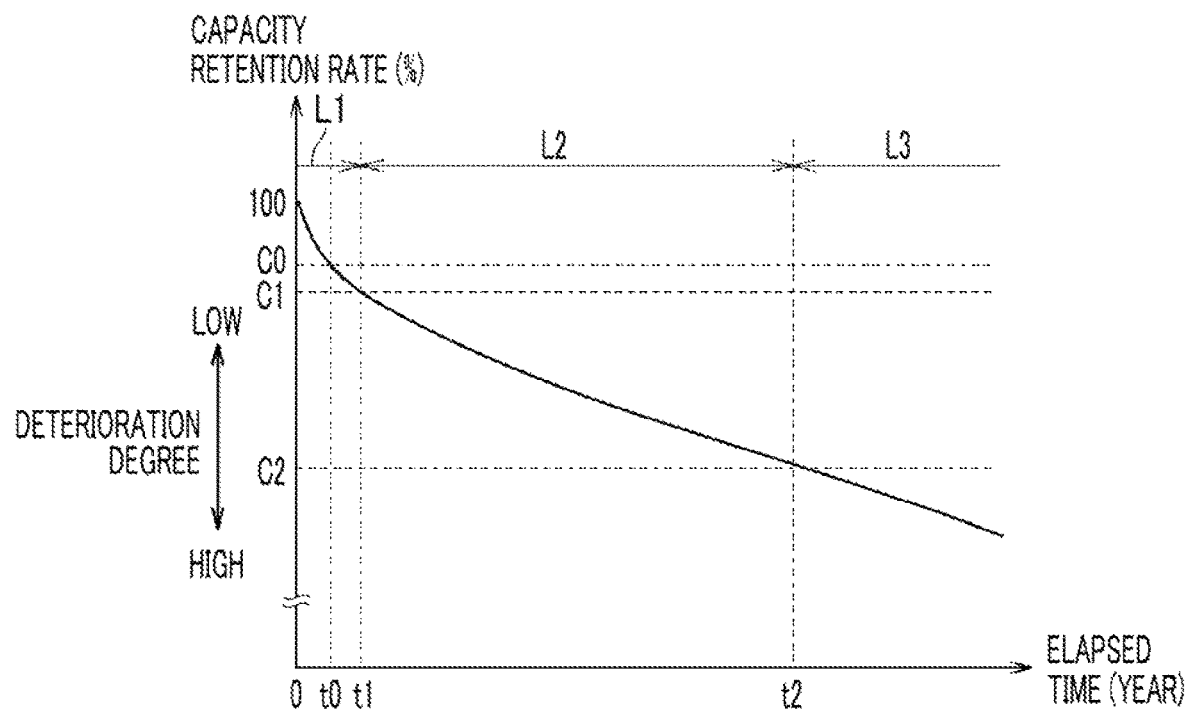
FIG. 2 is a view of an example of a deterioration curve showing that a main battery deteriorates over time.

FIG. 2 is a view of an example of a deterioration curve showing that the main battery 10 deteriorates over time. In FIG. 2, the horizontal axis shows an elapsed time (year) from the time of manufacturing the main battery 10 or the vehicle 100 and the vertical axis shows a capacity retention rate (%) of the main battery 10.

The capacity retention rate of main battery 10 is defined, for example, as a percentage of the current full charge capacity to a full charge capacity (Wh) (it may be Ah, and the same applies below) when the main battery 10 is new (at the time of manufacturing), and is one of parameters by which the deterioration degree of the main battery 10 can be quantitatively evaluated. From the above definition, it is understood that the higher the capacity retention rate, the lower the deterioration degree of the main battery 10, and the lower the capacity retention rate, the higher the deterioration degree of the main battery 10.

Referring to FIG. 2, as described above, in general, deterioration characteristics of the secondary battery have a tendency that the deterioration progresses rapidly at the initial stage immediately after manufacture, and then is rendered stable. The main battery 10 also has such a deterioration progress pace, and the slope of the deterioration curve is large at the initial stage immediately after the time of manufacture (time 0).

Time t0 is the delivery timing of the vehicle 100, that is, the use start timing of the vehicle 100 by the user. There is generally a time lag (for example, several weeks or several months) from when the main battery 10 is manufactured to when it is mounted on the vehicle 100 and the user starts using the vehicle 100 (main battery 10) at t0. In this period of time, since deterioration of main battery 10 progresses rapidly, when the deterioration degree of main battery 10 (capacity retention rate C0 (C0<00%)) is displayed at the time (time t0) when the user starts using the vehicle 100, the user may feel uncomfortable with the fact that the deterioration of the main battery 10 is already in progress at the time.

Therefore, in the vehicle 100 according to the first embodiment, when the deterioration degree of main battery 10 is lower than the lower limit value (first level), that is, when the capacity retention ratio of main battery 10 is higher than the upper limit value C1, The deterioration degree (capacity retention rate) of the main battery 10 is not displayed on the display 35. In this case, the display 35 displays a message indicating that the main battery 10 is not deteriorated. For example, C1=80% can beset as the lower limit value of the deterioration degree, that is, the upper limit value C1 of the capacity retention rate.

Then, when the deterioration degree is equal to or higher than the lower limit value, that is, when the capacity retention rate is equal to or lower than the upper limit value C1, the deterioration degree (capacity retention rate) is displayed on the display 35. As a result, it is possible to suppress the uncomfortable feeling of the user due to the fact that deterioration of main battery 10 is already in progress at the time when vehicle 100 is delivered.

In addition, in a state where deterioration of main battery 10 is in progress, when the degradation degree is specifically displayed to the user, the user can confirm the deterioration state of main battery 10. Meanwhile, for example, while 1 it is likely that the user who has a short trip distance may think that the main battery 10 need not be replaced yet. When deterioration of main battery 10 is in progress, it is likely that the actual storage amount (Wh) may be greatly reduced even though the SOC is a sufficient value and the storage amount may be suddenly depleted.

Therefore, in the vehicle 10 according to the first embodiment, when the deterioration degree of main battery 10 is higher than the upper limit value (second level), that is, even when the capacity retention ratio of main battery 10 is lower than the lower limit value C2. The deterioration degree (capacity retention rate) of the main battery 10 is not displayed on the display 35. In this case, the display 35 displays a message prompting replacement of the main battery 10. As a result, the user can be made to recognize that the replacement timing of the main battery 10 is approaching, and the user can be prompted to replace the main battery 10. For example, C2=30% can be set as the upper limit value of the deterioration degree, that is, the lower limit value C2 of the capacity retention rate.

Hereinafter, an example of a method of estimating the deterioration degree of the main battery 10 will be described with reference to FIGS. 3 to 5, and then, display control of the display 35 will be described with reference to FIGS. 6 and 7.

Figure 3:
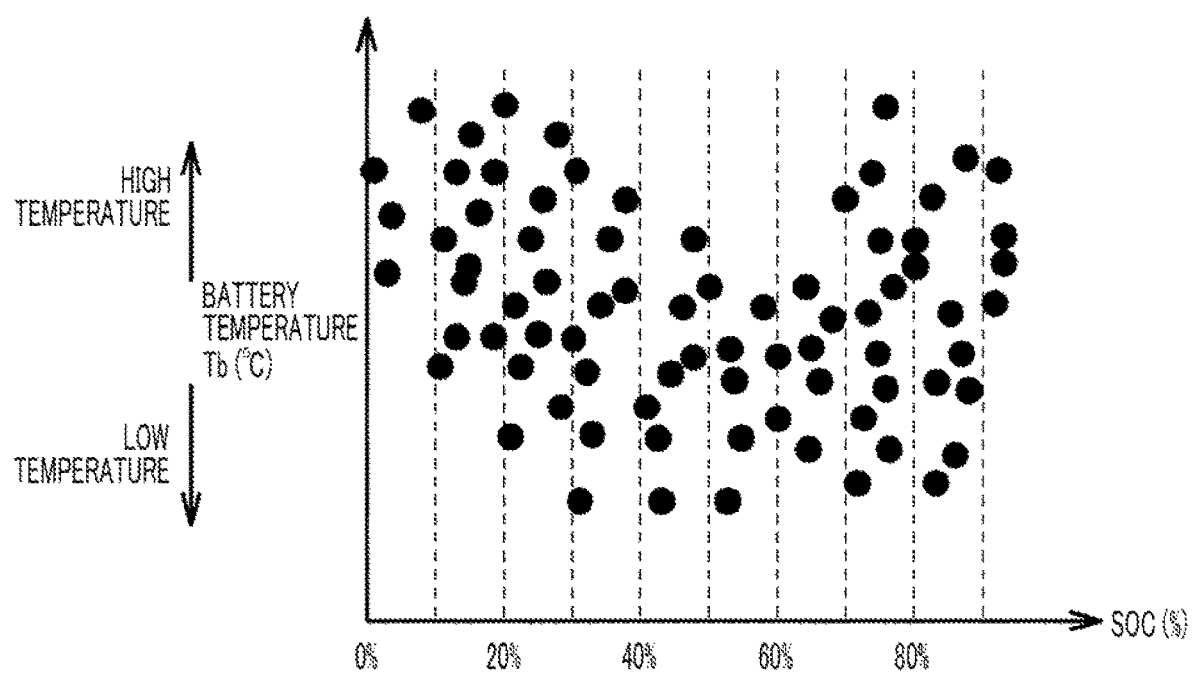
FIG. 3 is a scatter diagram of an SOC and a battery temperature of the main battery.

FIG. 3 is a scatter diagram of an SOC and a battery temperature Tb of the main battery 10. In FIG. 3, the horizontal axis indicates the SOC (%), and the vertical axis indicates the battery temperature Tb (° C.).

Referring to FIG. 3, with respect to battery use history data of the main battery 10 acquired by monitoring ECU 18 at predetermined timing (for example, every hour), combinations of the battery temperature Tb and the SOC (%) are plotted as points of scatter diagram. The scatter diagram shows the trend of the temperature and SOC at which the main battery 10 has been used so far. Depending on the previous use conditions of the vehicle 100, the scatter diagram shown in FIG. 3 will be different.

Figures 4, 5:
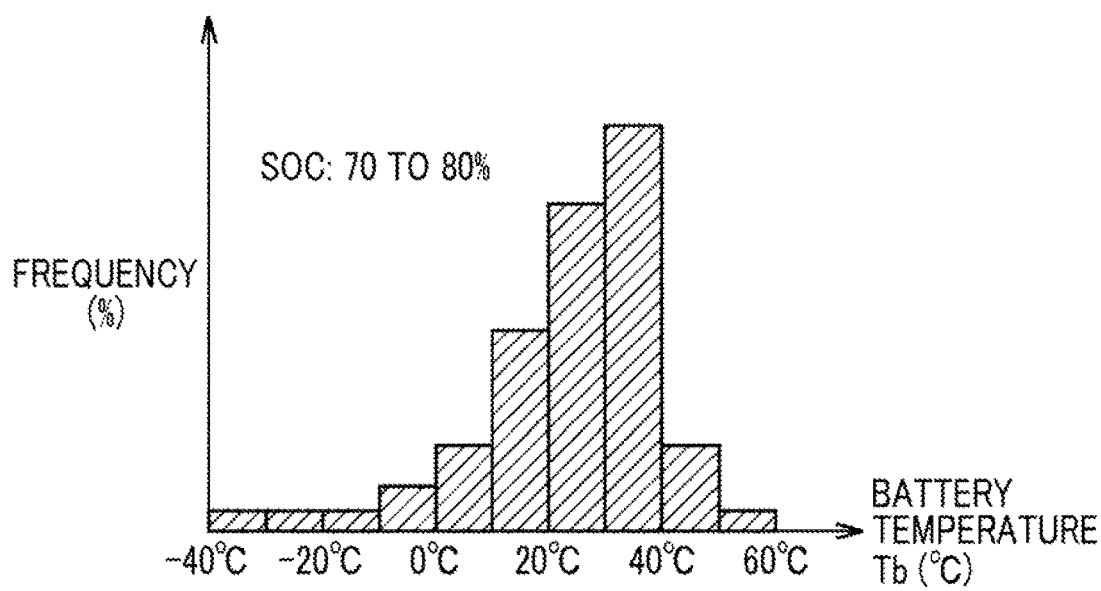
FIG. 4 is a histogram of the battery temperature in a certain SOC range obtained from the scatter diagram shown in FIG. 3.
FIG. 5 is a view describing an example of a definition of a use area of the main battery.

FIG. 4 is a histogram of the battery temperature Tb in a certain SOC range obtained from the scatter diagram shown in FIG. 3. FIG. 4 shows, for example, a frequency distribution in a range of every 10 (° C.) of the battery temperature Tb, using battery use history data in the range of 70 to 80(%) of the SOC in FIG. 3. As described above, a frequency distribution can be obtained for each range of the SOC (%) in the similar way as shown in FIG. 4.

Furthermore, since the appearance frequency of each SOC range can be determined, in each SOC range, the occurrence probability for each use area, which is defined by the combination of the SOC range and the battery temperature range is performed by multiplying the appearance frequency and the frequency distribution for each battery temperature range similar to FIG. 4, can be determined.

FIG. 5 is a view describing an example of a definition of a use area of the main battery 10. Referring to FIG. 5, by combining m (m: natural numbers of two or more) SOC ranges in 5(%) increments and n (n: natural numbers of two or more) battery temperature ranges in 5 (° C.) increments, n×m use areas R11 to Rmn can be defined.

As described above, the appearance probability of each of the m SOC ranges can be determined, and in each SOC range, the frequency distribution can be determined for the battery temperature range in 5 (° C.) increments. Therefore, occurrence frequencies P11 to Pmn corresponding to use areas R11 to Rmn can be calculated by multiplying the appearance probability of each SOC range by the appearance frequency of each battery temperature range in the SOC range. The total sum of the occurrence frequencies P11 to Pmn is 1.0.

In general, it is known that the progressing rate of deterioration increases over time as the secondary battery continues to have a high temperature and a high SOC state. Reflecting such characteristics of the secondary battery, the unit deterioration progress degree when the main battery 10 is used for a unit time (for example, one hour) in each of the use areas RI to Rmn can be determined in advance in the corresponding use areas R11 to Rmn. Here, the unit deterioration progress degree is indicated by the decrease amount (%/h) of the capacity retention rate per unit time. In this manner, unit deterioration progress degrees C11 to Cnm are stored in advance in the storage unit 32 in association with the corresponding use areas R11 to Rmn.

Furthermore, using the accumulated time Tt (h) from the start of use of the main battery 10, the use time in each of the use areas R11 to Rmn is indicated by Tt·P11 to Tt·Pmn. Then, the values obtained by multiplying the unit deterioration progress degree C11 to Cnm by the use time in each of the use areas R11 to Rmn is summed up, and the deterioration degree parameter R of the main battery 10 at the present time is calculated by the following equation (1).

$$R=1.0-Tt \cdot (P11 \cdot C11+ \ldots +Pmn \cdot Cmn) \quad (1)$$

The deterioration parameter R corresponds to an estimated value the capacity retention rate at the present time. R=1.0 (that is, the capacity retention rate is 100(%)) when the main battery 10 is new. With respect to the deterioration parameter R according to the equation (1), it is interpreted that "1.0−R" corresponds to the decrease rate of the full charging capacity from the initial state (that is, deterioration degree). In the following, although the deterioration degree of the main battery 10 is estimated using the deterioration parameter R, the lower the value of the deterioration parameter R, the higher the deterioration degree of the main battery 10.

Furthermore, it is also possible to modify the above equation (1) so as to further estimate the deterioration degree due to charge/discharge cycles using the history data of the battery load ($Ib^2$). The controller 30 can estimate the deterioration degree of the main battery 10 at the present time by calculating the deterioration degree parameter R as mentioned above. It should be noted that FIG. 3 to FIG. 5 only describe an example of the degradation degree estimation process, and when the deterioration degree parameter R for quantitatively estimating the current degradation degree can be calculated based on the past battery use history data, it is possible to estimate the deterioration degree using any method.

Figure 6:
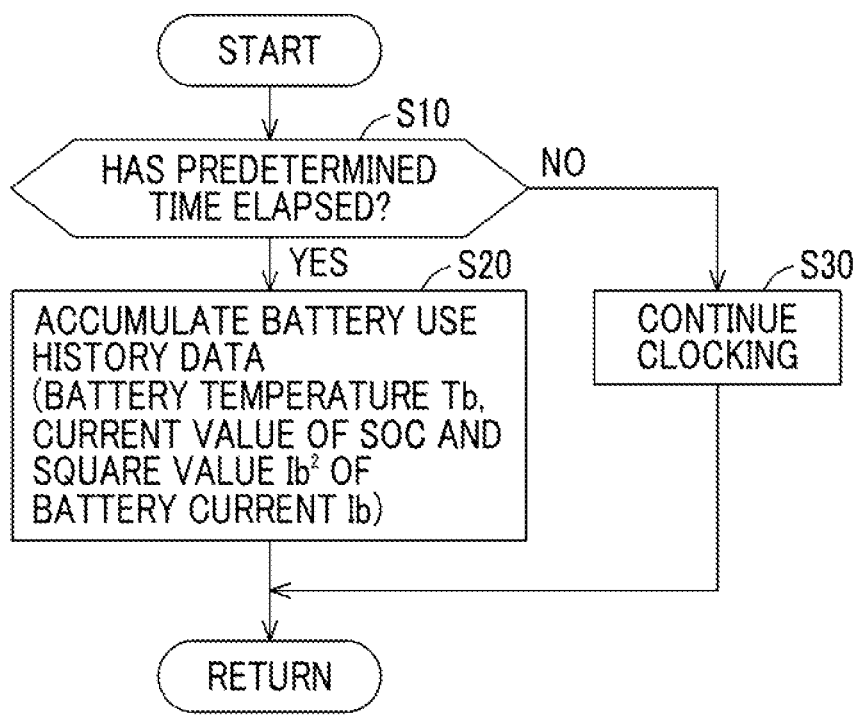
FIG. 6 is a flowchart describing accumulation processing of battery use history data.

FIG. 6 is a flowchart describing accumulation process of battery use history data. The process according to the flowchart can be executed by the controller 30.

Referring to FIG. 6, the controller 30 determines whether or not a predetermined time (for example, one hour) has elapsed since the previous transmission of battery use history data (step S10). For example, the elapsed time since the previous collection of battery use history data can be measured by a timer (not shown) built in controller 30.

The controller 30 continues clocking by the timer until the predetermined time elapses (NO in step S10)(step S30). The controller 30 can obtain the battery current Ib, the battery voltage Vb, the battery temperature Tb, and the SOC of the main battery 10 at any timing through the monitoring ECU 18.

If determination is made in step S10 that the predetermined time has elapsed (YES in step S10), the controller 30 stores battery use history data of the main battery 10 in the storage unit 32 (step S20). For example, data items of the battery temperature Tb, the current value of SOC, and square value ($Ib^2$) of the battery current Ib indicating a battery load are accumulated as battery use history data. Furthermore, in step S20, the count value by the timer is cleared in response to accumulating the battery use history data.

The battery use history data can be instantaneous value data at each timing after a predetermined time has elapsed. Alternatively, data (for example, an average value) obtained by statistically processing the battery temperature Tb, the SOC, the battery load and the like within the predetermined time may be stored in the storage unit 32 as battery use history data.

The process shown in FIG. 6 is executed when the vehicle 10 travels (when the start switch is on) and when the vehicle 100 is not traveling (when the start switch is off). That is, the process of FIG. 6 is executed even when the vehicle 100 is left standing in parking and when the vehicle 100 is externally charged, and both the travel time and the non-travel time of the vehicle 100 are included during the use time of the main battery 10.

Figure 7:
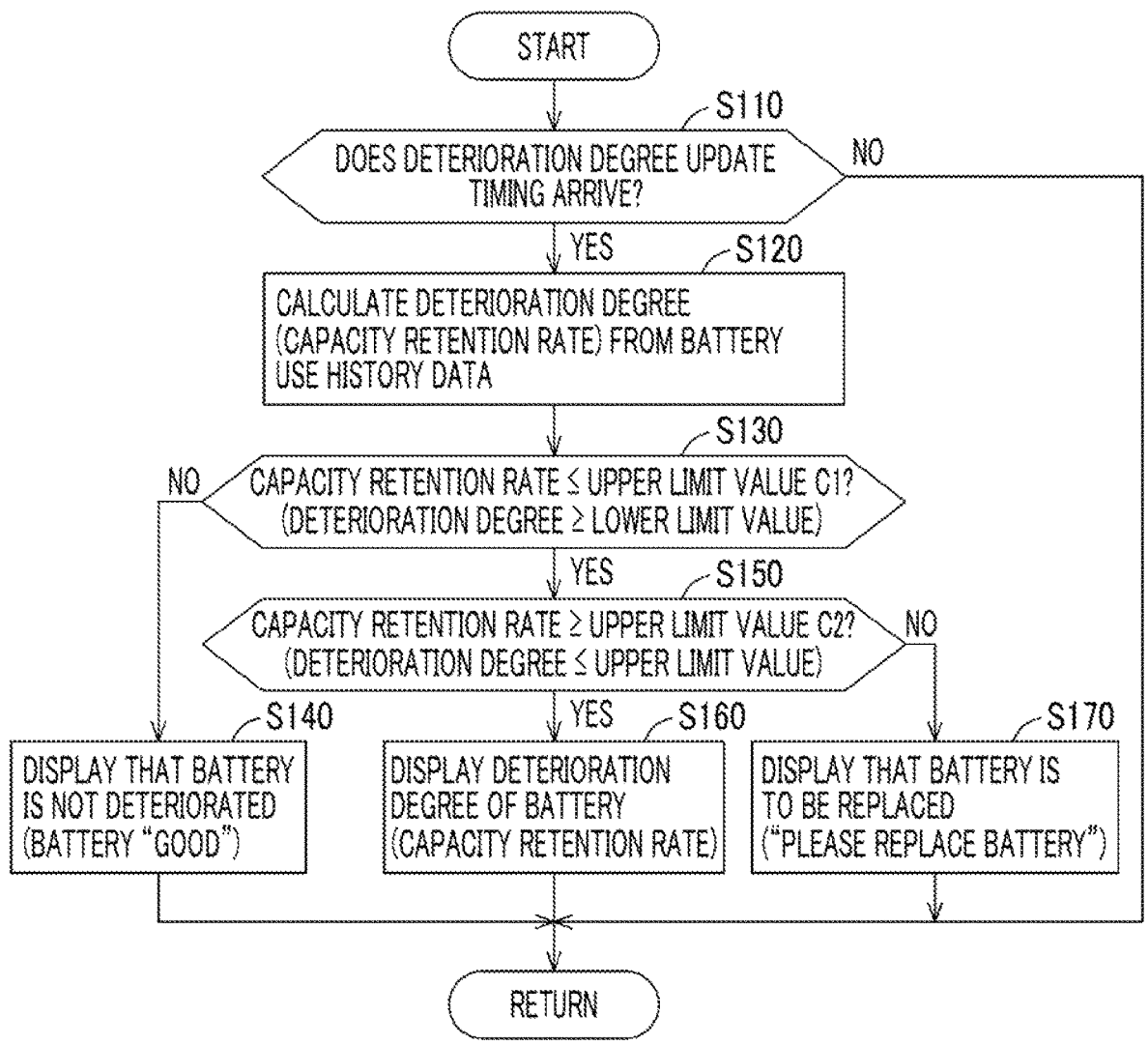
FIG. 7 is a flowchart showing an example of a procedure of a process of displaying a deterioration degree of the main battery on a display.

FIG. 7 is a flowchart showing an example of a procedure of a process of displaying a deterioration degree of the main battery 10 on the display 35. The process according to the flowchart can be executed by the controller 30.

Referring to FIG. 7, the controller 30 determines whether or not predetermined deterioration degree update timing arrives (step S110). For example, the deterioration degree update timing can be set to arrive at a certain cycle (for example, every predetermined number of months). For example, in step S110, determination can be made so as to detect whether or not deterioration degree update timing arrives, each time the process shown in FIG. 6 is performed a predetermined number of times.

When the deterioration degree update timing arrives in step S110 (YES in step S110), the controller 30 calculates the current deterioration degree (capacity retention rate) of the main battery 10 from the battery use history data stored in the storage unit 32 using the above equation (1) (step S120).

Next, the controller 30 determines whether or not the calculated capacity retention rate of the main battery 10 is equal to or lower than the upper limit value C1 (FIG. 2) (that is, whether or not the deterioration degree of the main battery 10 is higher than or equal to the lower limit value (first level) (Step S130). As described above, for example, C1=80% is set as the upper limit value C of the capacity retention rate.

When the capacity retention rate is higher than the upper limit value C (that is, the deterioration degree is lower than the lower limit value) (NO in step S130), the controller 30 controls the display 35 such that the display 35 displays a message indicating that the main battery 10 is not deteriorated (step S140).

Figure 8:
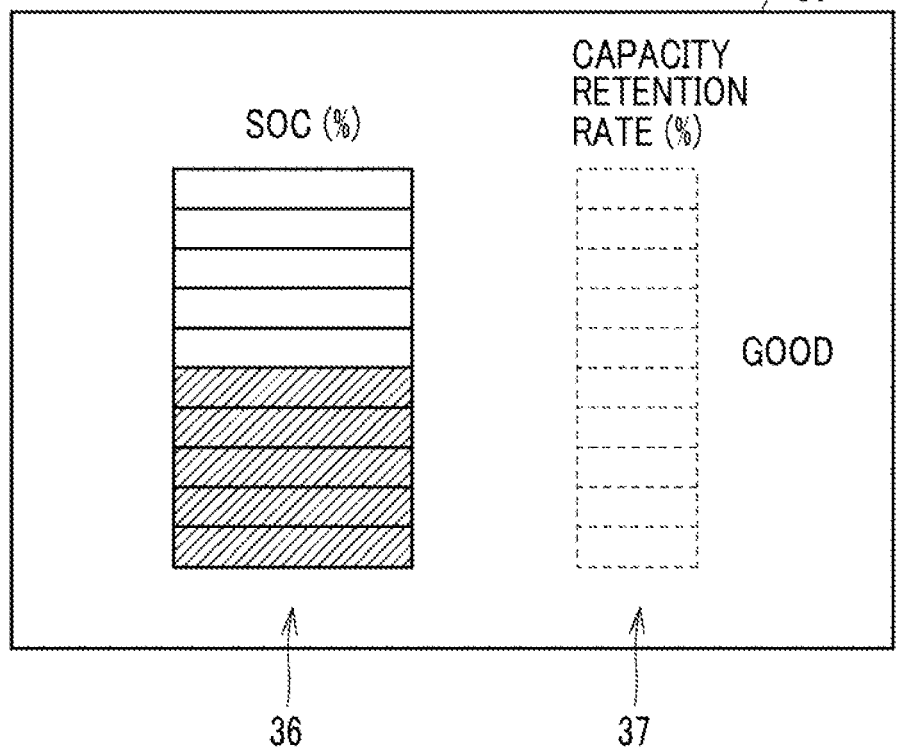
FIG. 8 is a view of an example of a display state of the display when a capacity retention rate is higher than the upper limit value.

FIG. 8 is a view of an example of a display state of the display 35 when the capacity retention rate is higher than the upper limit value C1. That is, FIG. 8 shows an example of the display state of the display 35 when the deterioration degree of the main battery 10 is lower than the lower limit value. In FIG. 2, the example of the display state in a period of time L1 (time 0 to t1) is shown.

Referring to FIG. 8, in an area 36 of the display 35, the current SOC of the main battery 10 is shown. The section of SOC value from the upper limit value (for example, 100%) to the lower limit value (for example, 0%) of the SOC are divided into a predetermined number of segments and displayed. In the example, the section of the SOC value is displayed using ten segments. Since the overcharge and overdischarge of the main battery 10 accelerate the deterioration of the main battery 10, the upper limit of the SOC displayed in the area 36 may be lower than 100% (for example 90%). The lower limit of the SOC displayed at the area 36 may be a value higher than 0% (for example, 10%).

When the current capacity retention rate (deterioration degree) of the main battery 10 can be shown in the area 37 of the display 35 (dotted line), in a case where the capacity retention rate is higher than upper limit value C1 (the deterioration degree is lower than lower limit value), the capacity retention rate (deterioration degree) is not displayed, and a message indicating that the main battery 10 is not deteriorated is displayed. As an example, the character "good" is displayed in the area 37, and it is displayed that the state of the main battery 10 is good (not deteriorated).

Referring to FIG. 7 again, when determination is made in step S130 that the capacity retention rate of the main battery 10 is equal to or lower than upper limit value C1 (that is, the deterioration degree is equal to or higher than the lower limit value) (YES in step S130), the controller 30 determines whether or not the capacity retention rate is equal to or higher than the lower limit value C2 (FIG. 2) (that is, whether or not the deterioration degree is equal to or lower than the upper limit (second level)) (step S150). As described above, for example, C2=30% is set as the lower limit value C2 of the capacity retention rate.

When the capacity retention rate is equal to or higher than the lower limit value C2 (that is, the deterioration degree is equal to or higher than the upper limit value) (YES in step S150), the controller 30 controls the display 35 such that the deterioration degree (capacity retention rate) of the main battery 10 which has been calculated in step S120 is displayed (step S160).

Figure 9:
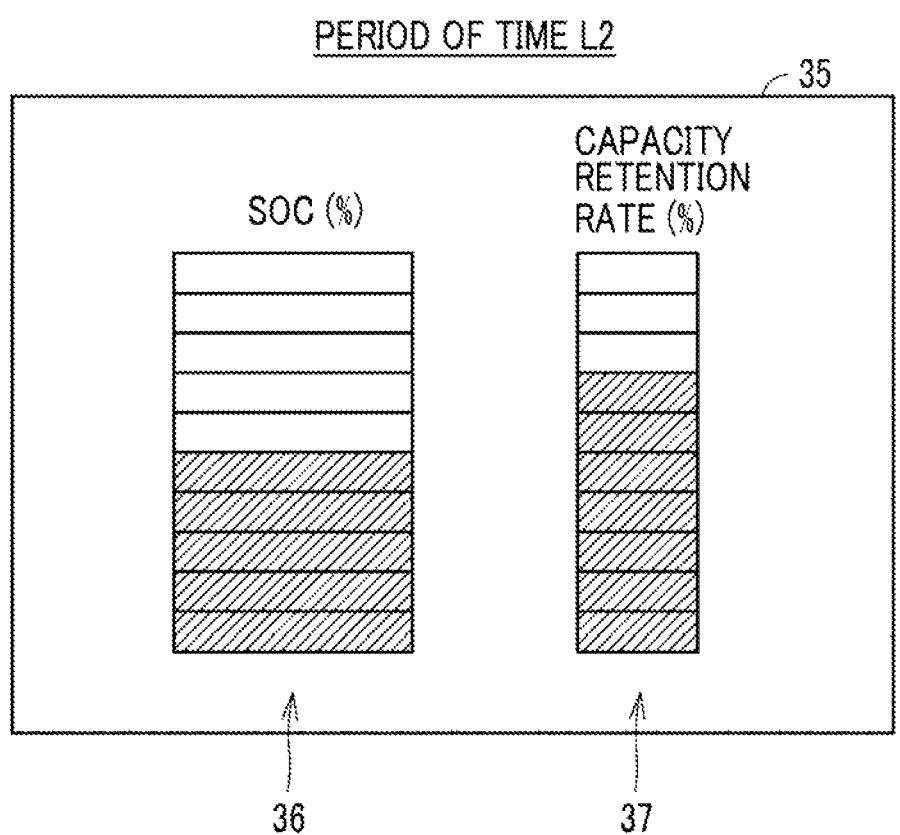
FIG. 9 is a view of an example of a display state of the display when the capacity retention rate is equal to or lower than the lower limit value and is equal to or higher than the lower limit value.

FIG. 9 is a view of an example of a display state of the display 35 when the capacity retention rate is equal to or lower than the upper limit value C1 and equal to or higher than the lower limit value C2. That is. FIG. 9 shows an example of the display state of the display 35 when the deterioration degree of the main battery 10 is equal to or lower than the lower limit value and equal to or lower than the upper limit value. In FIG. 2, the example of the display state in a period of time L2 (time t to t2) is shown.

Referring to FIG. 9, in an area 36 of the display 35, the current SOC of the main battery 10 is shown as in FIG. 8.

Then, in an area 37 of the display 35, the current capacity retention rate (deterioration degree) of the main battery 10 is shown. Specifically, the section of the value of the capacity retention rate from the upper limit to the lower limit of the capacity retention rate is divided into a predetermined number of segments and displayed. In the example, the section of the capacity retention rate is displayed using ten segments.

As described above, in the first embodiment, when the deterioration degree of the main battery 10 is displayed, the display of the deterioration degree is changed stepwise. That is, the display 35 changes the display of the deterioration degree stepwise with a predetermined number (ten in the example) of segments, instead of displaying the deterioration degree (capacity retention rate) calculated by the controller 30 as it is. When the deterioration degree calculated by the controller 30 is sequentially displayed, a user who feels anxious about the gradual increase in the deterioration degree is also supposed. By changing the display of the deterioration degree stepwise, the anxiety that the user can feel can be suppressed as compared with the case of changing the deterioration degree sequentially.

The upper limit and the lower limit of the capacity retention rate displayed in the area 37 may be, for example, 100% and 0%, respectively. In this case, when the capacity retention rate reaches the upper limit value C1 (for example, 80%), the message display of "Good" shown in FIG. 8 is switched to the segment display of the value of capacity retention rate shown in FIG. 9, and the display state is set such that 80% of the segment display lights up.

Alternatively, the upper limit and the lower limit of the capacity retention rate displayed in the area 37 may be, for example, the upper limit C1 (for example, 80%) and the lower limit C2 (for example, 30%) shown in FIG. 2. In this case, when the capacity retention rate reaches the upper limit value C1 (for example, 80%), the message display of "Good" shown in FIG. 8 is switched to the segment display of the value of capacity retention rate, and the display state is set such that all segments of the segment display light up.

Referring to FIG. 7 again, when determination is made in step S150 that the capacity retention rate of the main battery 10 is lower than the lower limit value C2 (that is, the deterioration degree is lower than the upper limit value) (NO in step S150), the controller 30 controls the display 35 such that the display 35 displays a message prompting replacement of the main battery 10 (step S170).

Figure 10:
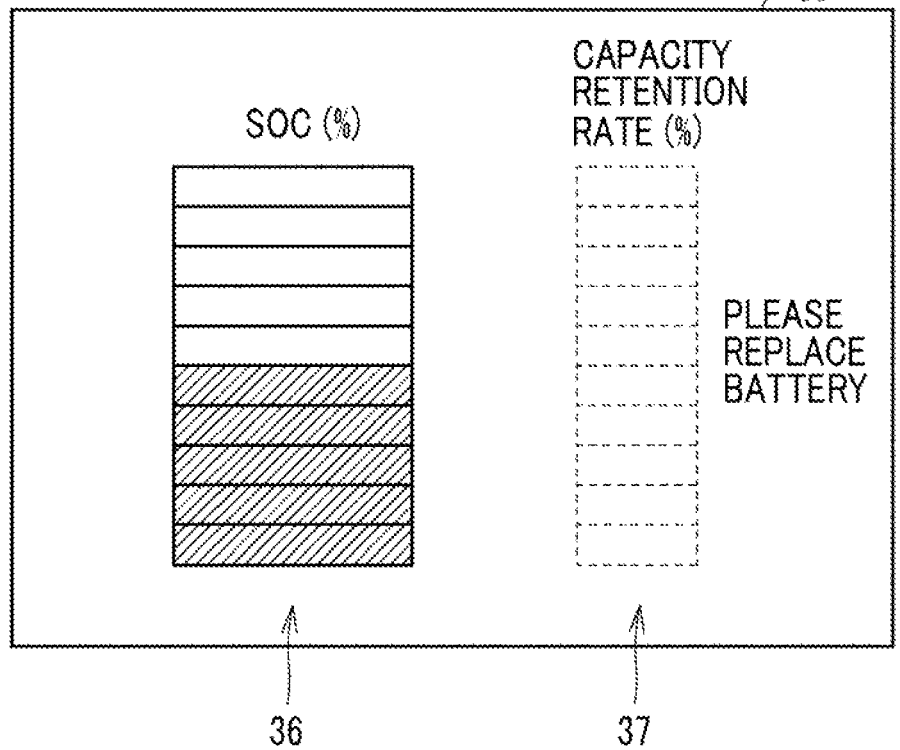
FIG. 10 is a view of an example of a display state of the display when the capacity retention rate is lower than the lower limit.

FIG. 10 is a view of an example of a display state of the display 35 when the capacity retention rate is lower than the lower limit value C2. That is. FIG. 10 shows an example of the display state of the display 35 when the deterioration degree of the main battery 10 is higher than the upper limit value. In FIG. 2, the example of the display state in a period of time L3 (after t2) is shown.

Referring to FIG. 10, in an area 36 of the display 35, the current SOC of the main battery 10 is shown as in FIGS. 8 and 9.

When the current capacity retention rate (deterioration degree) of the main battery 10 can be shown in the area 37 of the display 35 (dotted line), in a case where the capacity retention rate is lower than lower limit value C2 (the deterioration degree is higher than upper limit value), the capacity retention rate (deterioration degree) is not displayed, and a message prompting replacement of the main battery 10 is displayed. As an example, the characters "Replace battery" is displayed in the area 37, and it is displayed that the main battery 10 is needed to be replaced.

In the above description, the SOC of the main battery 10 is divided into a predetermined number of segments and displayed in the display 35, but instead of the segment display or in addition to the segment display, the SOC value itself may be displayed.

Further, with regard to the deterioration degree, when the deterioration degree of the main battery 10 is included in the range from the lower limit to the upper limit on the display 35 (when the capacity retention rate is included in the range from the upper limit C1 to the lower limit C2), the deterioration degree (capacity retention rate) of the main battery 10 is divided into a predetermined number of segments and displayed, but instead of the segment display or in addition to the segment display, the deterioration degree (capacity retention rate) itself may be displayed.

Furthermore, based on the capacity retention rate of the main battery 10, the drivable distance (km) of the vehicle 100 at the time of full charge of the main battery 10 may be displayed. Since the current full charge capacity (kWh) can be calculated from the full charge capacity in the initial state of the main battery 10 and the current deterioration degree (capacity retention rate), for example, the drivable distance (km) of the vehicle 100 at the time of the full charge of the main battery 10 can be calculated by multiplying the average electricity cost (km/kWh) of the vehicle 100 by the current full charge capacity (kWh). The drivable distance (km) of the vehicle 100 at the time of the full charge depends on the capacity retention rate of the main battery 10, and the drivable distance (km) can be also one parameter that allows the deterioration degree of the main battery 10 to be quantitatively evaluated.

As described above, according to the first embodiment, since, when the deterioration degree of the main battery 10 is lower than the lower limit value (first level), the deterioration degree is not displayed on the display 35, it is possible to suppress the uncomfortable feeling of the user due to the fact that deterioration of the main battery 10 is already in progress at the time of starting using the vehicle 100 (when the vehicle is delivery).

Further, according to the first embodiment, since, even when the deterioration degree of is higher than the upper limit value (second level), the deterioration degree is not displayed on the display 35. By not displaying the deterioration degree, it is possible to make the user recognize that the replacement timing of the main battery 10 is approaching.

Further, according to the first embodiment, since, when the deterioration degree is lower than the lower limit value, the message indicating that the main battery 10 is not deteriorated is specified on the display 35, it is possible to suppress the anxiety which the user feels about the fact that the deterioration degree is not displayed.

Further, according to the first embodiment, since, when the deterioration degree is higher than the upper limit value, the message prompting replacement of the main battery 10 is displayed on the display 35, it is possible to explicitly prompt the user to replace the main battery 10.

Further, according to the first embodiment, since, when the deterioration degree of the main battery 10 is displayed on the display 35, the display of the deterioration degree is changed stepwise, it is possible to suppress the anxiety that the user can feel about the increase in the deterioration degree as compared with a situation in which the deterioration degree is changed sequentially.

Second Embodiment

In the first embodiment described above, when the deterioration degree of the main battery 10 is lower than the lower limit value (first level), the deterioration degree is not displayed on the display 35, and furthermore, even when the deterioration degree is higher than the upper limit (second level), the deterioration degree is not displayed. However, instead of not displaying the deterioration degree, the display mode of the deterioration degree may be changed when the deterioration degree is equal to or higher than the lower limit and equal to or lower than the upper limit value.

A configuration of a vehicle to which a display device according to the second embodiment is applied is the same as that of the vehicle 100 shown in FIG. 1.

Figure 11:
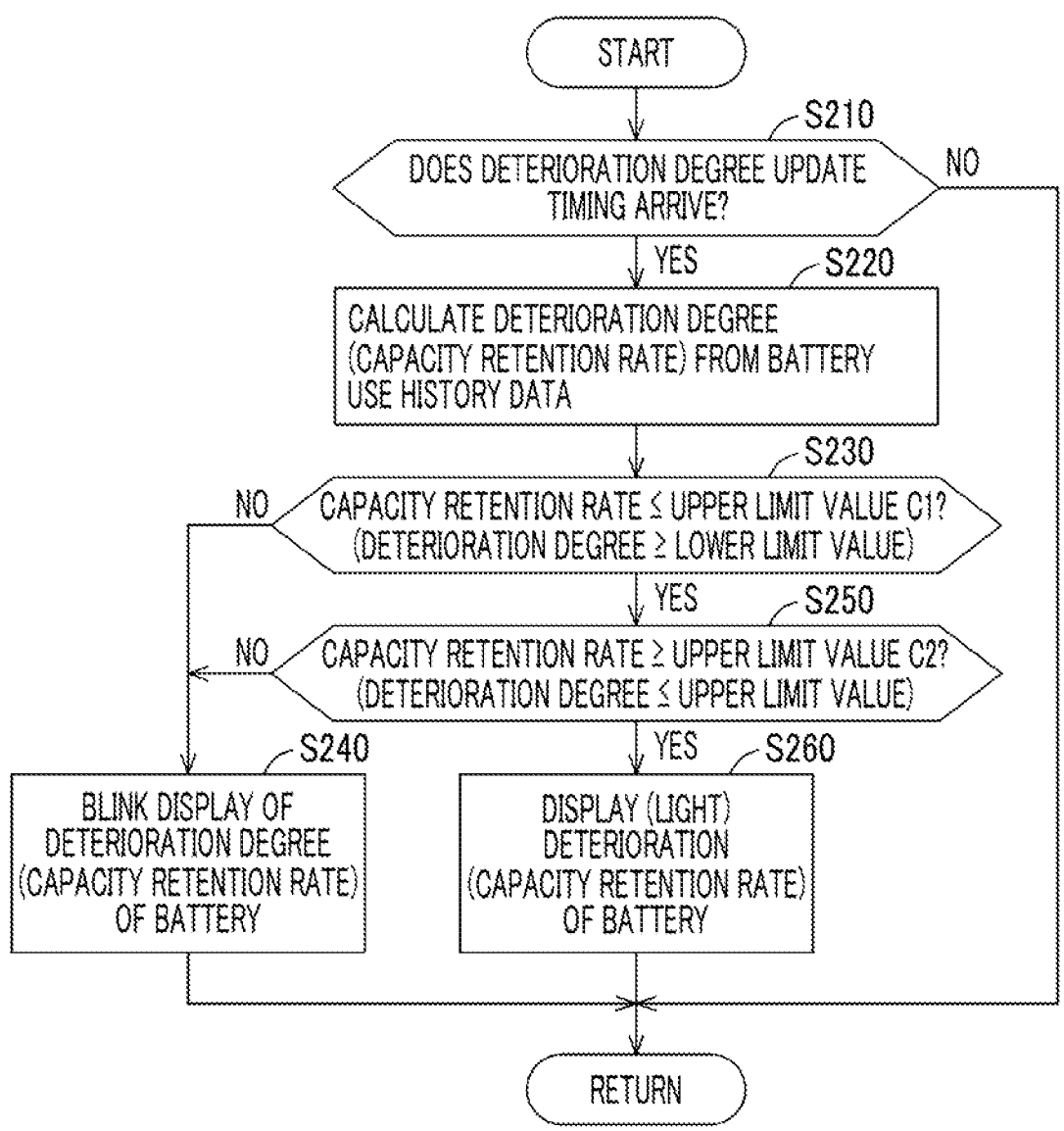
FIG. 11 is a flowchart showing an example of a procedure of a process of displaying a deterioration degree, according to a second embodiment.

FIG. 11 is a flowchart showing an example of a procedure of a process of displaying a deterioration degree, according to a second embodiment. The flowchart corresponds to the flowchart shown in FIG. 7.

Referring to FIG. 11, the process of steps S210 to S230 and S250 are the same as the process of steps S110 to S130 and S150 shown in FIG. 7. When determination is made in step S230 that the capacity retention rate of the main battery 10 that has been calculated in step S220 is higher than the upper limit value C1 (that is, the deterioration degree is lower than the lower limit value) (NO in step S230), the controller 30 controls the display 35 such that the deterioration degree (capacity retention rate) of the main battery 10 is displayed in a blinking state (step S240).

Figure 12:
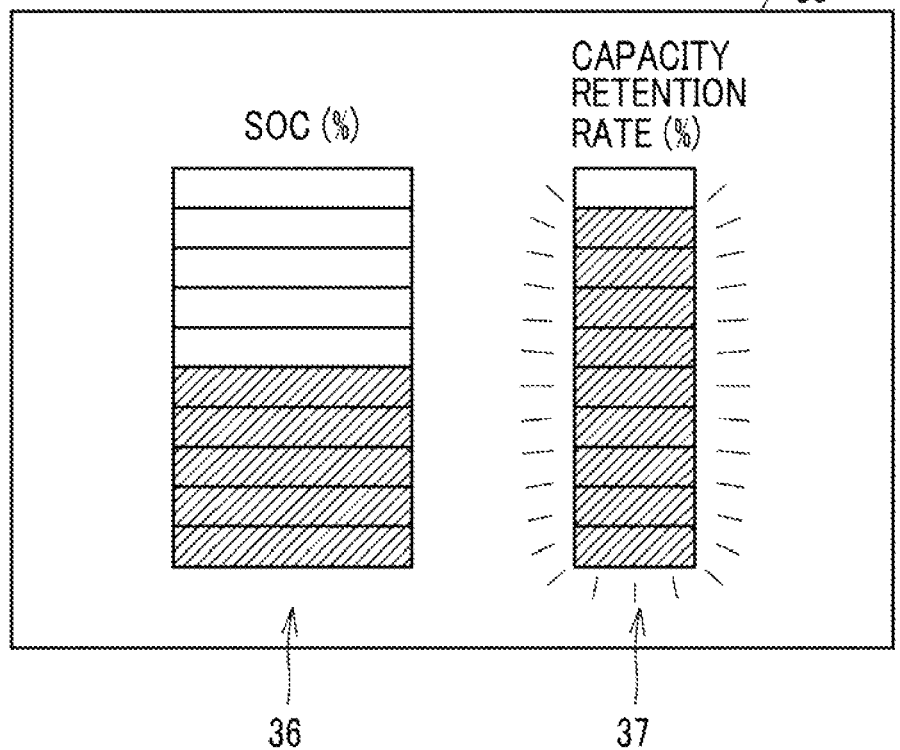
FIG. 12 is a view of an example of a display state of a display according to the second embodiment when a capacity retention rate exceeds the upper limit.

FIG. 12 is a view of an example of a display state of the display 35 when the capacity retention rate is higher than the upper limit value C1 in the second embodiment. FIG. 12 corresponds to FIG. 8 described in the first embodiment. Referring to FIG. 12, in an area 37 of the display 35, the current capacity retention rate (deterioration degree) of the main battery 10 is displayed in a blinking state.

Referring to FIG. 1 again, when determination is made in step S230 that the capacity retention rate of the main battery 10 is equal to or lower than upper limit value C1 (that is, the deterioration degree is equal to or higher than the lower limit value) (YES in step S230), the controller 30 determines whether or not the capacity retention rate is equal to or higher than the lower limit value C2 (that is, whether or not the deterioration degree is equal to or lower than the upper limit (second level))(step S250).

When the capacity retention rate is equal to or higher than the lower limit value C2 (that is, the deterioration degree is equal to or higher than the upper limit value) (YES in step S250), the controller 30 controls the display 35 such that the deterioration degree (capacity retention rate) of the main battery 10 that has been calculated in step S220 is displayed (in a lighting state)(step S260).

On the other hand, when determination is made in step S250 that the capacity retention rate is lower than the lower limit value C2 (that is, the deterioration degree is higher than the upper limit value) (NO in step S250), the controller 30 makes the process proceed to S240, and controls the display 35 such that the deterioration degree (capacity retention rate) of the main battery 10 is displayed in a blinking state.

Figure 13:
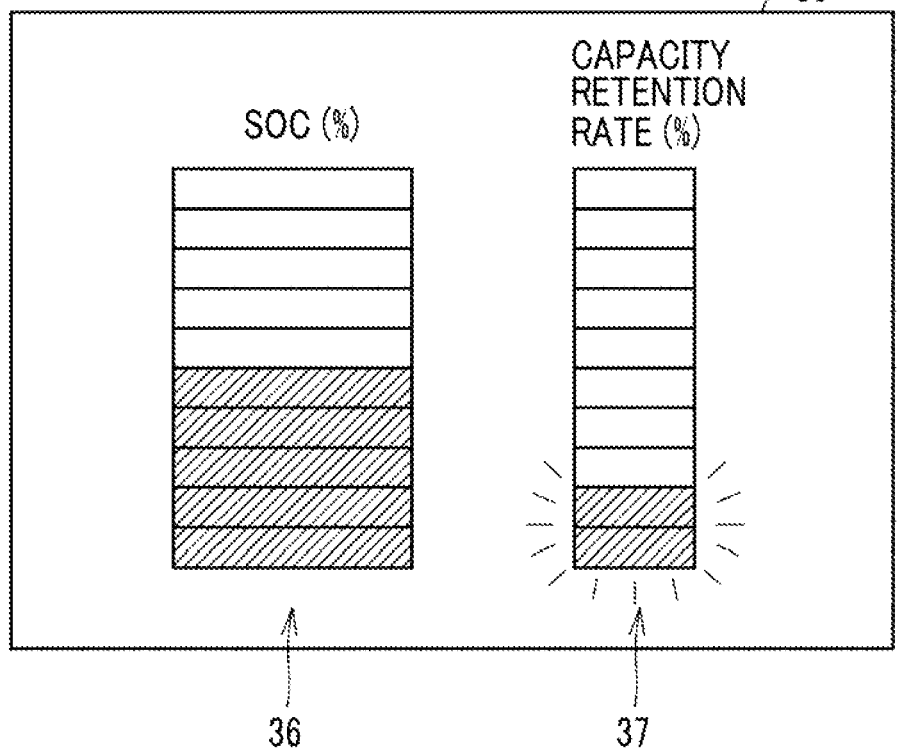
FIG. 13 is a view of an example of the display state of the display according to the second embodiment when the capacity retention rate is lower than the lower limit value.

FIG. 13 is a view of an example of the display state of the display 35 when the capacity retention rate is lower than the lower limit value C2 in the second embodiment. FIG. 13 corresponds to FIG. 10 described in the first embodiment. Referring to FIG. 13, in an area 37 of the display 35, the current capacity retention rate (deterioration degree) of the main battery 10 is displayed in a blinking state.

Although not shown in particular, the blinking state of the display of the deterioration degree (FIG. 12) when the capacity retention rate is higher than the upper limit C1 (NO in step S230) and the blinking state of the display of the deterioration degree (FIG. 13) when the capacity retention rate is lower than the lower limit value C2 (NO in step S250) may be different from each other.

In the above, when the deterioration degree of the main battery 10 is lower than the lower limit value (first level) or when the deterioration degree is higher than the upper limit value (second level), the display mode of the deterioration degree is changed by blinking the display of the deterioration degree when the deterioration degree is equal to or higher than the lower limit value and equal to or lower than the upper limit value, but it may be changed to a display mode other than blinking. For example, when the deterioration degree is lower than the lower limit value (first level) or when the deterioration degree is higher than the upper limit value (second level), the display color, or the display shade or size of the deterioration degree may be changed when the deterioration degree is equal to or higher than the lower limit value and equal to or lower than the upper limit value.

As described above, according to the second embodiment, the display mode of the deterioration degree is different between when the deterioration degree of the main battery 10 is lower than the lower limit value (first level) or when the deterioration degree is higher than the upper limit value (second level) and when the deterioration degree is equal to or higher than the lower limit value and equal to or lower than the upper limit value, and thus the same effect as the first embodiment can be also obtained in the second embodiment.

Third Embodiment

In the first embodiment described above, when the deterioration degree of the main battery 10 is lower than the lower limit value (first level), the message indicating that the main battery 10 is not deteriorated is displayed without displaying the deterioration degree on the display 35. In addition, when the deterioration degree is higher than the upper limit value (second level), a message prompting replacement of the main buttery 10 is displayed without displaying the deterioration degree on the display 35.

In a third embodiment, when the deterioration degree of the main battery 10 is lower than the lower limit value (first level), the deterioration degree is displayed on the display 35 and the message indicating that the main battery 10 is not deteriorated is displayed. In addition, even when the deterioration degree is higher than the upper limit value (second level), the deterioration degree is displayed on the display 35 and message prompting replacement of the main battery 10 is displayed.

A configuration of a vehicle to which a display device according to the third embodiment is applied is the same as that of the vehicle 100 shown in FIG. 1.

Figure 14:
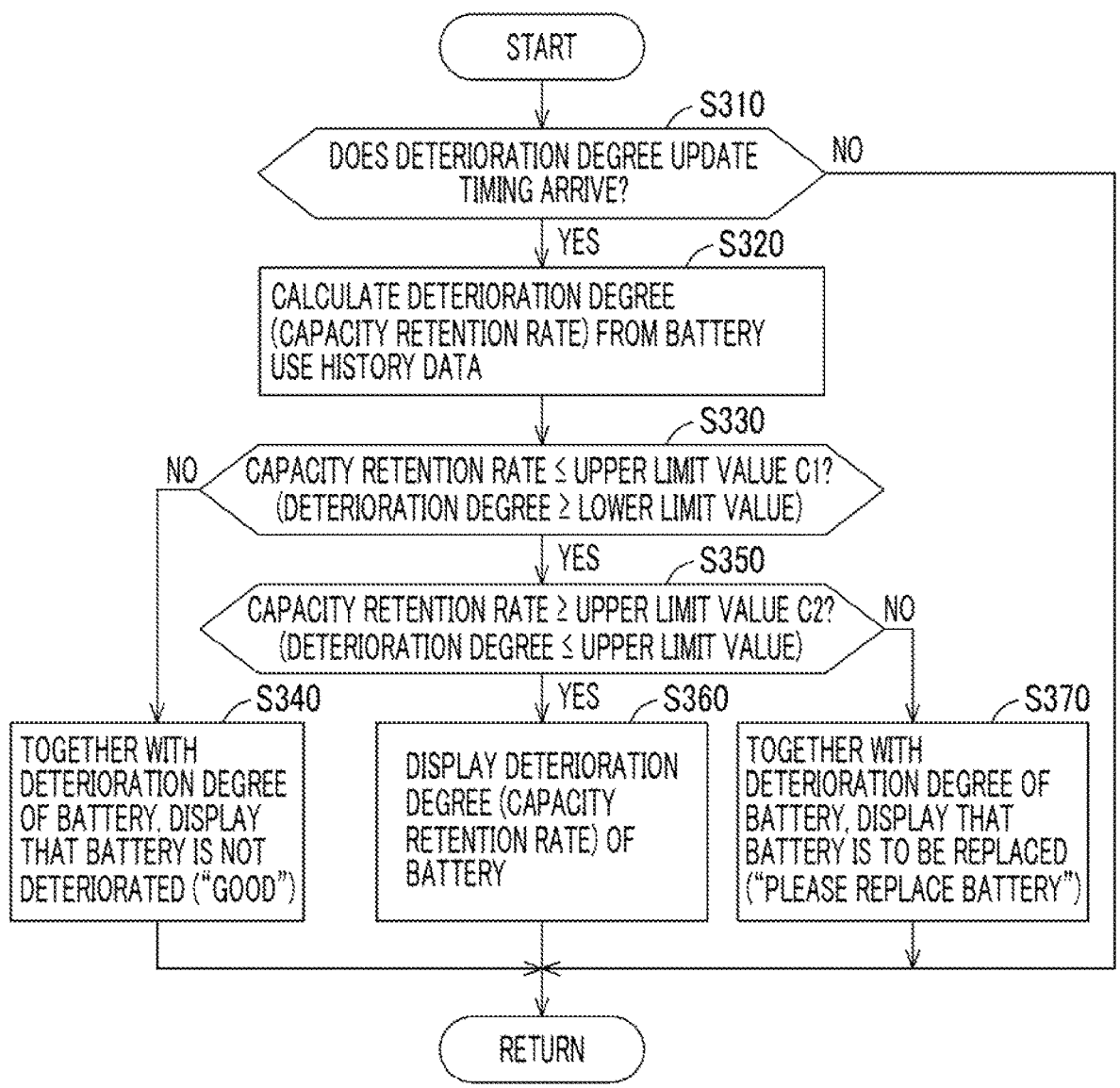
FIG. 14 is a flowchart showing an example of a procedure of a process of displaying a deterioration degree, according to a third embodiment.

FIG. 14 is a flowchart showing an example of a procedure of a process of displaying the deterioration degree, according to the third embodiment. The flowchart also corresponds to the flowchart shown in FIG. 7.

Referring to FIG. 14, the processes of steps S310 to S330, S350 and S360 are the same as the processes of steps S110 to S130, S150 and S160 shown in FIG. 7. When determination is made in step S330 that the capacity retention rate of the main battery 10 that has been calculated in step S320 is higher than the upper limit value C1 (that is, the deterioration degree is lower than the lower limit value)(NO in step S330), the controller 30 controls the display 35 such that the deterioration degree (capacity retention rate) of the main battery 10 that has been calculated in S320 and the message indicating that the main battery 10 is not deteriorated are displayed (step S340).

Figure 15:
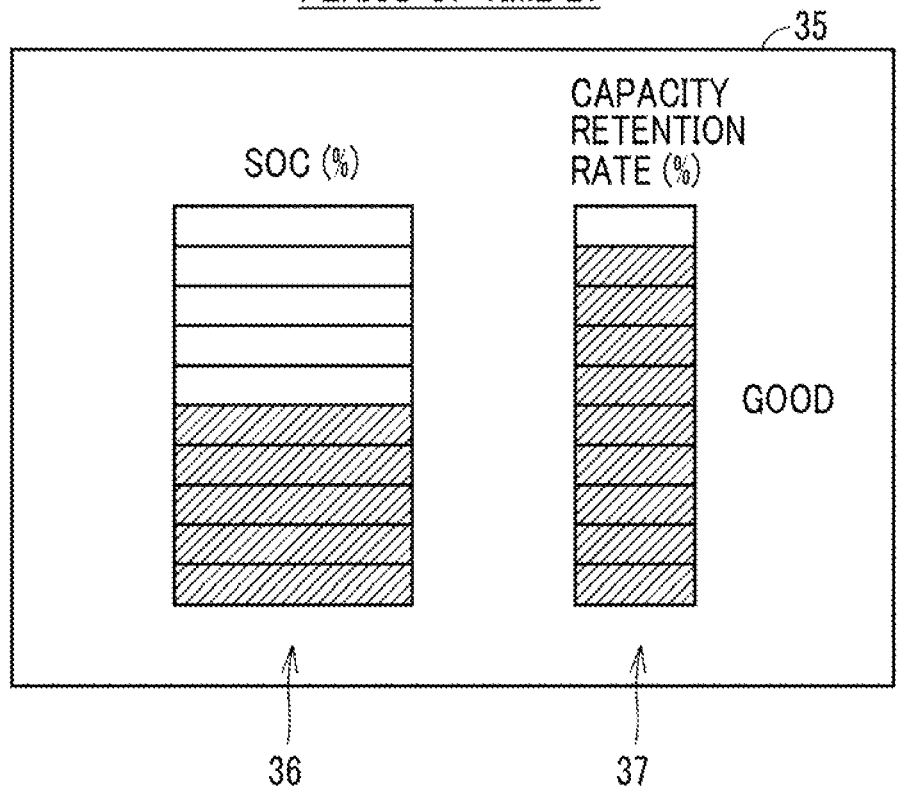
FIG. 15 is a view of an example of a display state of a display according to the third embodiment when a capacity retention rate exceeds the upper limit.

FIG. 15 is a view of an example of a display state of the display 35 when the capacity retention rate is higher than the upper limit value C1 in the third embodiment. FIG. 15 corresponds to FIG. 8 described in the first embodiment. Referring to FIG. 15, in the area 37 of the display 35, the current capacity retention rate (deterioration degree) of main battery 10 is displayed, and the message indicating that the main battery 10 is not deteriorated (for example, "Good") is displayed.

Referring to FIG. 14 again, when determination is made in step S330 that the capacity retention rate of the main battery 10 is equal to or lower than upper limit value C1 (that is, the deterioration degree is equal to or higher than the lower limit value) (YES in step S330), the controller 30 determines whether or not the capacity retention rate is equal to or higher than the lower limit value C2 (that is, whether or not the deterioration degree is equal to or lower than the upper limit (second level)) (step S350).

When the capacity retention rate is equal to or higher than the lower limit value C2 (that is, the deterioration degree is equal to or higher than the upper limit value) (YES in step S350), the controller 30 makes the process proceed to step S360, and causes the display 35 to display the deterioration degree (capacity retention rate) of the main battery 10 which has been calculated in step S220.

On the other hand, when determination is made in step S350 that the capacity retention rate is lower than the lower limit value C2 (that is, the deterioration degree is higher than the upper limit value) (NO in step S350), the controller 30 controls the display 35 such that the deterioration degree (capacity retention rate) of the main battery 10 which has been calculated in step S320 and the message prompting replacement of the main battery 10 are displayed (step S370).

Figure 16:
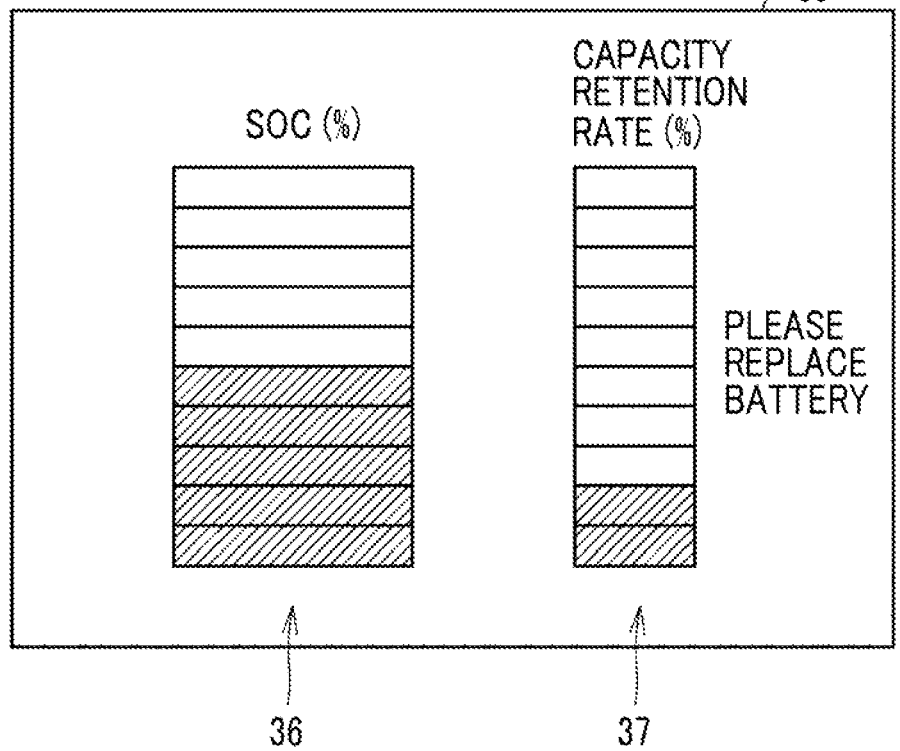
FIG. 16 is a view of an example of the display state of the display according to the third embodiment when the capacity retention rate is lower than the lower limit.

FIG. 16 is a view of an example of the display state of the display 35 when the capacity retention rate is lower than the lower limit value C2 in the third embodiment. FIG. 16 corresponds to FIG. 10 described in the first embodiment. Referring to FIG. 16, in the area 37 of display 35, the current capacity retention rate (deterioration degree) of the main battery 10 is displayed, and a message prompting replacement of the main battery 10 (for example "Please replace battery") is displayed.

As described above, in the third embodiment, the same effect as that of the first embodiment can be obtained.

Modified Example

In the first embodiment described above, when the deterioration degree of the main battery 10 is lower than the lower limit value (first level), the deterioration degree is not displayed on the display 35, and furthermore, even when the deterioration degree is higher than the upper limit (second level), the deterioration state is not displayed on the display 35. However, the deterioration degree may be set to be displayed on the display 35 merely when the deterioration degree is lower than the lower limit (first level). Alternatively, the deterioration degree may be set not to be displayed on the display 35 merely when the deterioration degree is higher than the upper limit value (second level).

When the deterioration degree is set not to be displayed on the display 35 merely when the deterioration degree is lower than the lower limit value (first level) (merely when the capacity retention rate of the main battery 10 is higher than the upper limit value C1), the process of displaying the deterioration degree does not include steps S150 and S170 in the flowchart shown in FIG. 7.

On the other hand, when the deterioration degree is set not to be displayed on the display 35 merely when the deterioration degree is higher than the upper limit value (second level)(merely when the capacity retention rate of the main battery 10 is lower than the lower limit value C2), the process of displaying the deterioration degree does not include steps S130 and S140 in the flowchart shown in FIG. 7.

Similarly, in the second embodiment described above, when the deterioration degree of the main battery 10 is lower than the lower limit value (first level), the display state of the deterioration degree is changed, and furthermore, even when the deterioration degree is higher than the upper limit (second level), the display state of the deterioration state. However, the display state of the deterioration degree may be set to be changed merely when the deterioration degree is lower than the lower limit (first level). Alternatively, the display state of the deterioration degree may be set to be changed merely when the deterioration degree is higher than the upper limit value (second level).

Similarly, in the third embodiment described above, when the deterioration degree of the main battery 10 is lower than the lower limit value (first level), on the display 35, a message is displayed and the deterioration degree is displayed, and furthermore, even when the deterioration degree is higher than the upper limit (second level), on the display 35, the message is displayed and the deterioration degree is displayed. However, the deterioration degree may be displayed, and the message may be displayed on the display 35 merely when the deterioration degree is lower than the lower limit (first level). Alternatively, the message may be displayed and the deterioration degree is displayed on the display 35 merely when the deterioration degree is higher than the upper limit value (second level).

In each embodiment, the deterioration degree of the main battery 10 and the message are assumed to be displayed in the display 35 of the vehicle 100. However, the displaying may be performed by a system outside the vehicle.

Figure 17:
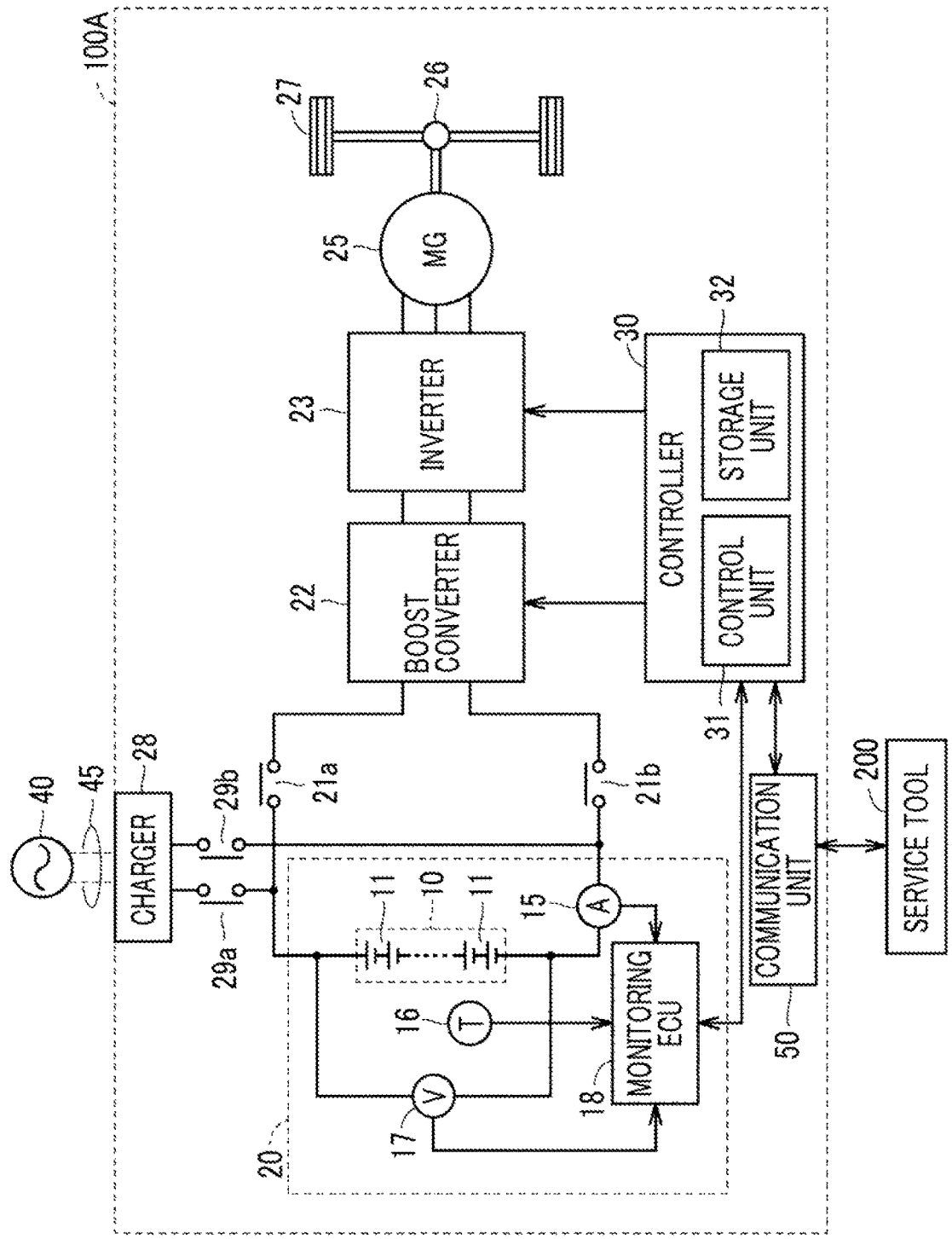
FIG. 17 is a block diagram of a configuration example in which a deterioration degree of a main battery is displayed outside a vehicle.

FIG. 17 is a block diagram of a configuration example in which the deterioration degree of the main battery 10 is calculated outside a vehicle. Referring to FIG. 17, in the modified example, a vehicle 100A has the same configuration as the vehicle 100 shown in FIG. 1 except that it does not include the display 35 and further includes a communication unit 50.

The communication unit 50 has a function of executing communication with a service tool 200 provided outside the vehicle 100A. Communication with the service tool 200 may be wired or wireless. The communication unit 50 can be formed, for example, by an on-vehicle wireless communication module.

The service tool 200, which is possessed, for example, by a dealer or the like, calculates the deterioration degree of the main battery 10 from battery use history data of the main battery 10 acquired from the vehicle 100A. In the vehicle 100A, battery use history data of the main battery 10 is collected and stored in the storage unit 32, and when communication is established between the service tool 200 and the communication unit 50, the battery use history data stored in the storage unit 32 is transmitted to the service tool 200 by the communication unit 50.

Then, in the service tool 200, the current deterioration degree of the main battery 10 is calculated from the battery use history data acquired from the vehicle 100A. The deterioration degree is, for example, the current capacity retention rate of the main battery 10, as in the above embodiment. The capacity retention rate of the main battery 10 can be calculated using the above equation (1).

In the above embodiment, the deterioration degree of the main battery 10 is calculated by the controller 30 of the vehicle 100. However, the deterioration degree may be calculated by the server 230 outside the vehicle.

Figure 18:
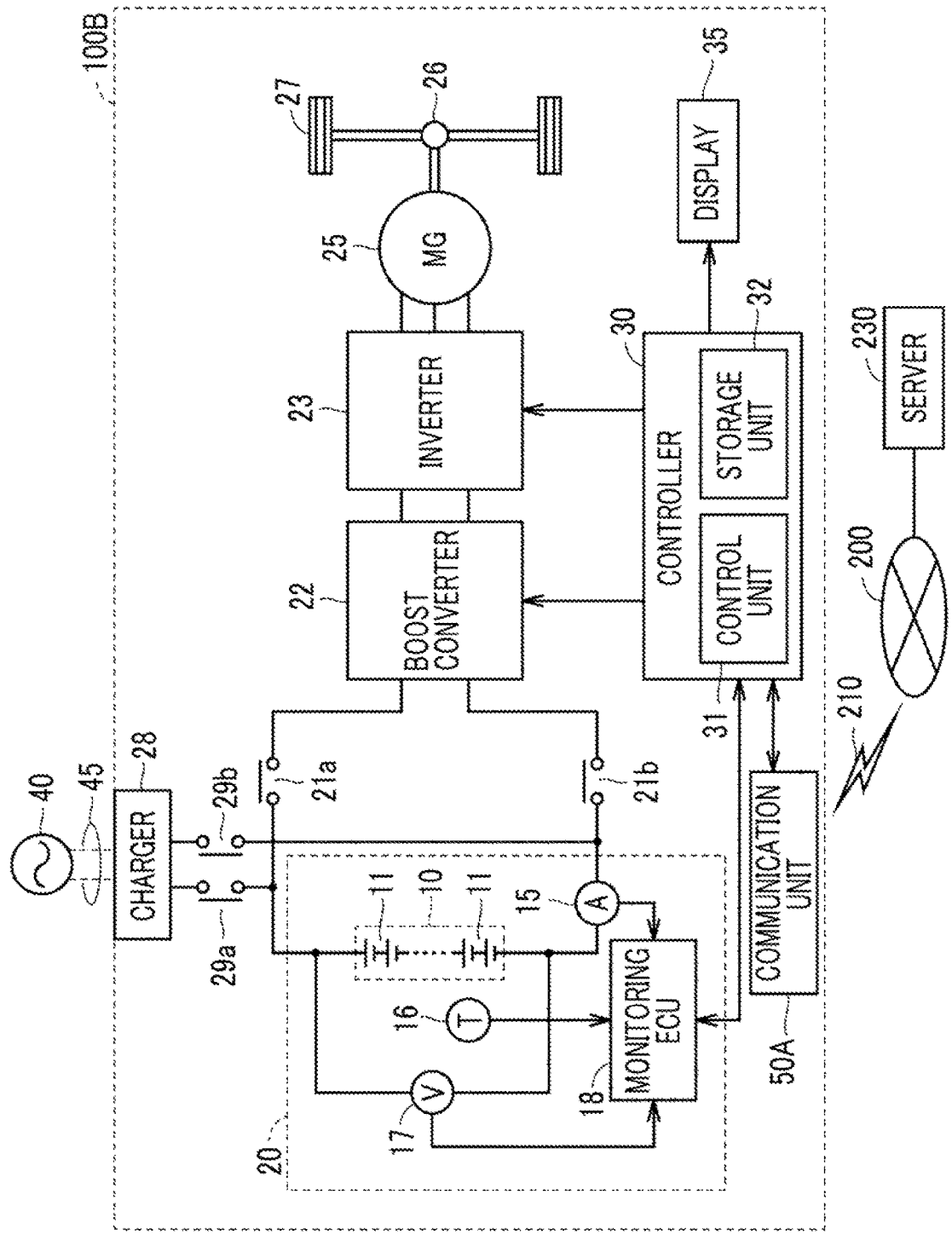
FIG. 18 is a block diagram of a configuration example in which a deterioration degree of a main battery is calculated outside a vehicle.

FIG. 18 is a block diagram of a configuration example in which a deterioration degree of a main battery 10 is calculated outside a vehicle. Referring to FIG. 18, in the modified example, a vehicle 100B has the same configuration as the vehicle 100 shown in FIG. 1 except that it further includes a communication unit 50A.

A communication unit 50A forms a communication path 210 with a server 230 provided outside the vehicle 100B, and has a function of executing wireless communication. For example, the communication unit 50A can be formed by an on-vehicle wireless communication module.

The vehicle 100B can perform two-way data communication with the server 230 by connecting to the wide area communication network 220 (typically, the Internet) through the communication path 210 by the communication unit 50A. When a predetermined deterioration degree update timing arrives, battery use history data of the main battery 10 is transmitted from the vehicle 100B to the server 230.

When the server 230 acquires the battery use history data of the main battery 10 from the vehicle 100B, the server 230 calculates the deterioration degree of the main battery 10 from the acquired battery use history data. The deterioration degree is, for example, the current capacity retention rate of the main battery 10 as in the above embodiment. The capacity retention rate of the main battery 10 can be calculated using the above equation (1). Then, the server 230 transmits the calculated deterioration degree (capacity retention rate) to the vehicle 100B.

The deterioration degree (capacity retention rate) received by the vehicle 100B is displayed on the display 35. When the deterioration degree is lower than the lower limit value (when the capacity retention rate is higher than the upper limit C1), the message indicating that the main battery 10 is not deteriorated is displayed on the display 35, which is the same as that of the first embodiment. Furthermore, when the deterioration degree is higher than the upper limit value (the capacity retention rate is lower than the lower limit value C2), the message prompting replacement of the main battery 10 is displayed on the display 35, which is also the same as that of the first embodiment.

Although the display device is applied to the vehicle in embodiments and modifications, the display device according to the present disclosure is not limited to the device applied to the vehicle, and can be applied to other devices in which the deterioration degree is displayed.

The embodiments disclosed herein are to be understood as being exemplary and not to be construed as being limitative of the present disclosure in every respect. Furthermore, the scope of the present disclosure is indicated in the claims, not in the descriptions of the embodiments, and is intended to include all changes and modifications which do not constitute departure from the true spirit and scope of the present disclosure as claimed in the claims and equivalents thereto.

What is claimed is:

1. A display device comprising:
a display configured to display a deterioration degree of a secondary battery and configured to display a notification; and
a controller configured to control the display such that the display does not display the deterioration degree and displays a notification indicating that the secondary battery is not deteriorated when the deterioration degree is lower than a first level, or is configured to control the display such that the display does not display the deterioration degree and displays a notification prompting replacement of the secondary battery when the deterioration degree is higher than a second level that is higher than the first level.

2. The display device according to claim 1, wherein:
the controller is configured to control the display such that the display does not display the deterioration degree and displays the notification indicating that the secondary battery is not deteriorated when the deterioration degree is lower than the first level; and
the controller is configured to control the display such that the display does not display the deterioration degree and displays the notification prompting replacement of the secondary battery when the deterioration degree is higher than the second level.

3. The display device according to claim 1, wherein the controller is configured to control the display such that the display changes display of the deterioration degree stepwise when the display displays the deterioration degree.

4. The display device according to claim 1, wherein the controller is configured to control the display such that the display displays a notification prompting replacement of the secondary battery when the deterioration degree is higher than the second level.

5. A display device comprising:
a display configured to display a deterioration degree of a secondary battery; and
a controller configured to control the display such that the display does not display the deterioration degree when the deterioration degree is lower than a first level, or configured to control the display such that the display does not display the deterioration degree when the deterioration degree is higher than a second level that is higher than the first level,
wherein the controller is configured to control the display such that the display displays a notification indicating that the secondary battery is not deteriorated when the deterioration degree is lower than the first level.

* * * * *